(12) United States Patent
Ishibashi

(10) Patent No.: US 10,192,757 B2
(45) Date of Patent: Jan. 29, 2019

(54) SUBSTRATE CLEANING APPARATUS AND SUBSTRATE CLEANING METHOD

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 619 days.

(21) Appl. No.: 14/321,796

(22) Filed: Jul. 1, 2014

(65) Prior Publication Data

US 2015/0034121 A1 Feb. 5, 2015

(30) Foreign Application Priority Data

Jul. 3, 2013 (JP) .................................. 2013-139622
Jul. 17, 2013 (JP) .................................. 2013-148403

(51) Int. Cl.
*H01L 21/67* (2006.01)

(52) U.S. Cl.
CPC .. *H01L 21/67046* (2013.01); *H01L 21/67051* (2013.01)

(58) Field of Classification Search
CPC ..................... H01L 21/67046; H01L 21/67051
USPC ........................................................ 134/902
See application file for complete search history.

(56) References Cited

U.S. PATENT DOCUMENTS

| | | | |
|---|---|---|---|
| 6,241,584 B1* | 6/2001 | Aoki ................. | H01L 21/67046 451/41 |
| 7,743,449 B2 | 6/2010 | Mikhaylichenko et al. | |
| 2006/0096048 A1* | 5/2006 | Mikhaylichenko ....... | B08B 1/04 15/77 |
| 2008/0314870 A1 | 12/2008 | Inoue et al. | |
| 2012/0160267 A1* | 6/2012 | Kodera ..................... | B08B 1/04 134/6 |

FOREIGN PATENT DOCUMENTS

| | | |
|---|---|---|
| CN | 1965395 A | 5/2007 |
| CN | 101146410 A | 3/2008 |
| CN | 102479736 A | 5/2012 |
| JP | H09-223681 A | 8/1997 |
| JP | 2003-142444 A | 5/2003 |
| JP | 2005-194585 A | 7/2005 |

(Continued)

OTHER PUBLICATIONS

Machine translation of JP2008-161739 dated Jul. 2008.*

*Primary Examiner* — Douglas Lee
(74) *Attorney, Agent, or Firm* — Baker & Hostetler LLP

(57) ABSTRACT

A substrate cleaning apparatus capable of quickly removing cleaning liquid that has been used in cleaning of a substrate with a roll cleaning tool from the substrate. The substrate cleaning apparatus includes a substrate holder configured to hold and rotate a substrate; a cleaning-liquid supply nozzle configured to supply cleaning liquid onto a first region of the substrate; a roll cleaning tool configured to be placed in sliding contact with the substrate in the presence of the cleaning liquid to thereby clean the substrate; and a fluid supply nozzle configured to supply fluid, which is constituted by pure water or chemical liquid, onto a second region of the substrate. The second region is located at an opposite side of the first region with respect to the roll cleaning tool, and a supply direction of the fluid is a direction from a central side toward a peripheral side of the substrate.

13 Claims, 14 Drawing Sheets

(56) References Cited

FOREIGN PATENT DOCUMENTS

| | | | |
|---|---|---|---|
| JP | 2007-194244 A | | 8/2007 |
| JP | 2008-142590 A | | 6/2008 |
| JP | 2008-161739 A | | 7/2008 |
| JP | 2008161739 A | * | 7/2008 |
| JP | 2010-231861 A | | 10/2010 |
| JP | 2010-278103 | | 12/2010 |
| TW | 200933791 A | | 8/2009 |

* cited by examiner

SUBSTRATE CLEANING APPARATUS AND SUBSTRATE CLEANING METHOD

CROSS REFERENCE TO RELATED APPLICATIONS

This document claims priorities to Japanese Patent Application Number 2013-139622 filed Jul. 3, 2013 and Japanese Patent Application Number 2013-148403 filed Jul. 17, 2013, the entire contents of which are hereby incorporated by reference.

BACKGROUND

In a manufacturing process of a semiconductor device, various films having different physical properties are formed on a silicon substrate and these films are subjected to various processes, thus forming fine metal interconnects. For example, in a damascene interconnect forming process, interconnect trenches are formed in a film, and the interconnect trenches are then filled with metal, such as Cu. Thereafter, an excessive metal is removed by chemical mechanical polishing (CMP), so that metal interconnects are formed. After polishing of a substrate, the substrate is usually cleaned by a substrate cleaning apparatus. The substrate is cleaned by rotating the substrate horizontally and rubbing a roll cleaning tool, such as a roll sponge, against the substrate while supplying a cleaning liquid, such as chemical liquid, from a supply nozzle onto the substrate.

When the substrate is scrub-cleaned with the roll cleaning tool in the presence of the cleaning liquid, cleaning debris, such as particles, is generated. As a result, the cleaning liquid containing the cleaning debris is present on the substrate. It is preferable to remove such cleaning liquid from the substrate as quickly as possible. However, since the substrate is rotated horizontally, it takes a certain amount of time to remove the cleaning liquid from the substrate by a centrifugal force. As the substrate is rotated, the cleaning liquid on the substrate is brought into contact with the roll cleaning tool again and is then pushed back toward a central side of the substrate by a fresh cleaning liquid supplied from the supply nozzle. As a result, the cleaning liquid containing the cleaning debris remains on the substrate for a long time and dilutes the fresh cleaning liquid that has been supplied to the substrate, thus lowering a cleaning efficiency.

As a conventional substrate cleaning apparatus, there has been known an apparatus for cleaning a substrate by bringing a roll sponge into contact with a surface of the substrate while rotating the substrate in a vertical position. FIG. 14 is a schematic side view showing a conventional substrate cleaning apparatus, and FIG. 15 is a front view of the substrate cleaning apparatus shown in FIG. 14. As shown in FIGS. 14 and 15, the substrate cleaning apparatus includes two rollers 101, 102 for supporting and rotating a substrate W in a vertical position, two roll sponges 104, 105 that contact both surfaces of the substrate W supported by the rollers 101, 102, and cleaning-liquid supply nozzles 106, 107, 108 for supplying cleaning liquid onto the both surfaces of the substrate W.

The substrate W is cleaned as follows. The substrate W is rotated by the two rollers 101, 102, while the roll sponges 104, 105 are rotated about their axes. In this state, the cleaning liquid is supplied onto the substrate W from above the roll sponges 104, 105. The both surfaces of the substrate W are scrub-cleaned with the roll sponges 104, 105 in the presence of the cleaning liquid.

In the conventional apparatus shown in FIGS. 14 and 15, the roll sponges 104, 105 are rotated in respective directions such that the substrate W is pushed downward, and the two rollers 101, 102 support a downward load of the substrate W. However, such a configuration has the following drawbacks. The surfaces of the substrate W are cleaned by the sliding contact between the roll sponges 104, 105 and the substrate W in the presence of the cleaning liquid. Therefore, a region where the highest cleaning effect is achieved on the surface of the substrate W is a region C where a relative velocity between the roll sponges 104, 105 and the substrate W is maximized.

The cleaning liquid existing on the region C is brought into contact with the roll sponges 104, 105 again at a region D as the substrate W is rotated. The cleaning liquid that has been used in cleaning of the substrate W at the region C contains the cleaning debris, such as particles. Therefore, when the cleaning liquid that has once been used in cleaning of the substrate is again brought into contact with the roll sponges 104, 105 at the region D, the cleaning debris may be attached to the roll sponges 104, 105. Moreover, the cleaning liquid containing the cleaning debris is pushed back inwardly on the substrate W by a fresh cleaning liquid supplied from the outside of the substrate W, and is therefore unlikely to be removed from the substrate W. Consequently, the used cleaning liquid may dilute the fresh cleaning liquid, resulting in a lowered cleaning effect.

SUMMARY OF THE INVENTION

It is therefore a first object to provide a substrate cleaning apparatus and a substrate cleaning method which can quickly remove cleaning liquid that has been used in cleaning of a substrate, such as a wafer, with a roll cleaning tool from the substrate.

Further, it is a second object to provide a substrate cleaning apparatus and a substrate cleaning method which can improve a substrate cleaning effect and can quickly remove cleaning liquid containing cleaning debris from the substrate.

Embodiments, which will be described below, relate to a substrate cleaning apparatus and a substrate cleaning method which clean a substrate, such as a wafer, with a roll cleaning tool while supplying cleaning liquid onto the substrate. The substrate cleaning apparatus and the substrate cleaning method according to the embodiments are applicable to cleaning of not only a wafer having a diameter of 300 mm but also a wafer having a diameter of 450 mm, and is further applicable to a manufacturing process of a flat panel, a manufacturing process of an image sensor, such as CMOS and CCD, a manufacturing process of a magnetic film for MRAM, and other processes.

In an embodiment, there is provided a substrate cleaning apparatus comprising: a substrate holder configured to hold and rotate a substrate; a cleaning-liquid supply nozzle configured to supply cleaning liquid onto a first region of the substrate; a roll cleaning tool configured to be placed in sliding contact with the substrate in the presence of the cleaning liquid to thereby clean the substrate; and a fluid supply nozzle configured to supply fluid, which is constituted by pure water or chemical liquid, onto a second region of the substrate, wherein the second region is located at an opposite side of the first region with respect to the roll cleaning tool, and a supply direction of the fluid is a direction from a central side toward a peripheral side of the substrate.

In an embodiment, the second region is a region downstream of the roll cleaning tool with respect to a rotational direction of the substrate.

In an embodiment, the supply direction of the fluid is a direction from the central side toward the peripheral side of the substrate along the roll cleaning tool.

In an embodiment, a supply angle of the fluid with respect to a surface of the substrate is in a range of 5 degrees to 60 degrees.

In an embodiment, the first region of the substrate is located upstream of the roll cleaning tool with respect to a rotational direction of the substrate, and extends linearly along the roll cleaning tool.

In an embodiment, the fluid supply nozzle is arranged so as to form a flow of the fluid on a surface of the substrate such that the flow of the fluid crosses a center line of the substrate which is perpendicular to a longitudinal direction of the roll cleaning tool.

In an embodiment, the substrate holder is configured to rotate the substrate in such a state that the substrate is inclined at a predetermined angle with respect to a horizontal plane.

In an embodiment, the substrate cleaning apparatus further comprises a cleaning-tool rotating mechanism configured to rotate the roll cleaning tool in a direction as to raise the substrate.

In an embodiment, the roll cleaning tool has a length longer than a width of the substrate.

In an embodiment, the substrate holder comprises at least three holding rollers configured to hold a peripheral portion of the substrate, and a substrate rotating mechanism configured to rotate at least one of the holding rollers, wherein at least one of the holding rollers is arranged at a position as to support an upward force transmitted from the roll cleaning tool to the substrate.

In an embodiment, the predetermined angle is not less than 30 degrees and not more than 90 degrees.

In an embodiment, there is provided a substrate cleaning method comprising: holding and rotating a substrate; supplying cleaning liquid onto a first region of the substrate; placing a roll cleaning tool in sliding contact with the substrate in the presence of the cleaning liquid; and supplying fluid, which is constituted by pure water or chemical liquid, onto a second region of the substrate when cleaning the substrate, wherein the second region is located at an opposite side of the first region with respect to the roll cleaning tool, and a supply direction of the fluid is a direction from a central side toward a peripheral side of the substrate.

In an embodiment, the second region is a region downstream of the roll cleaning tool with respect to a rotational direction of the substrate.

In an embodiment, the supply direction of the fluid is a direction from the central side toward the peripheral side of the substrate along the roll cleaning tool.

In an embodiment, a supply angle of the fluid with respect to a surface of the substrate is in a range of 5 degrees to 60 degrees.

In an embodiment, the first region of the substrate is located upstream of the roll cleaning tool with respect to a rotational direction of the substrate, and extends linearly along the roll cleaning tool.

In an embodiment, a flow of the fluid is formed on a surface of the substrate such that the flow of the fluid crosses a center line of the substrate which is perpendicular to a longitudinal direction of the roll cleaning tool.

In an embodiment, the substrate is rotated in such a state that the substrate is inclined at a predetermined angle with respect to a horizontal plane.

In an embodiment, placing the roll cleaning tool in sliding contact with the substrate is performed by rotating the roll cleaning tool in a direction as to raise the substrate.

In an embodiment, the predetermined angle is not less than 30 degrees and not more than 90 degrees.

According to the embodiments described above, the cleaning liquid that has contacted the roll cleaning tool is carried away quickly from the substrate by the flow of the fluid comprising the pure water or the chemical liquid. Therefore, a newly-supplied cleaning liquid is not diluted with the used cleaning liquid, and as a result the cleaning efficiency can be improved.

According to the embodiments described above, the cleaning liquid, supplied onto a region at which a relative velocity between the roll cleaning tool and the substrate is the highest, is moved to a lower region of the substrate surface as the substrate is rotated. Since the substrate is inclined at the predetermined angle, the cleaning liquid moved to the lower region is removed quickly from the substrate by the own weight of the cleaning liquid and a centrifugal force. Therefore, the substrate cleaning effect can be improved.

DESCRIPTION OF EMBODIMENTS

Figure 1:
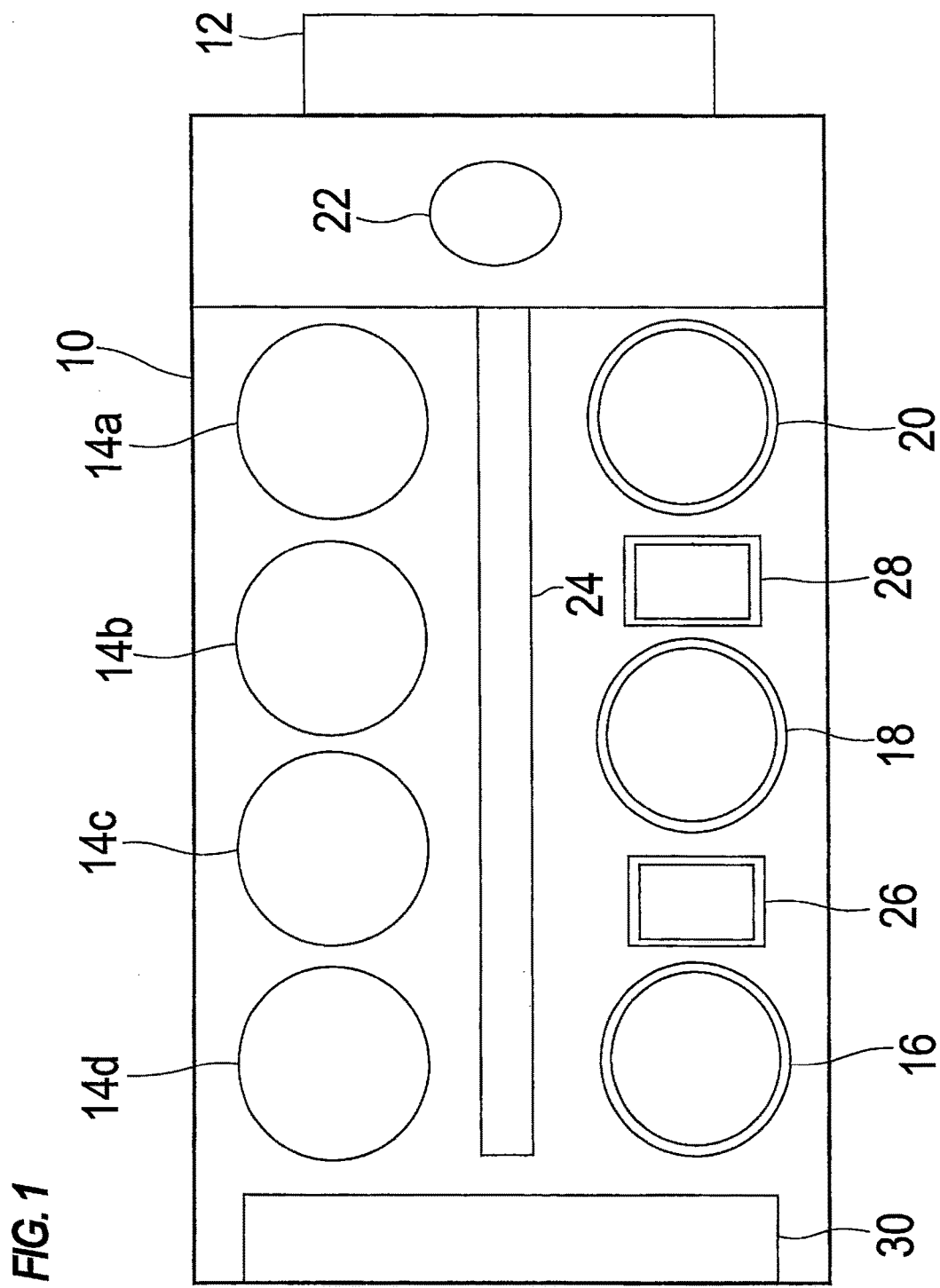
FIG. 1 is a plan view showing a whole structure of a substrate processing apparatus including a substrate cleaning apparatus according to an embodiment.

Embodiments will now be described with reference to the drawings. FIG. 1 is a plan view showing a whole structure of a substrate processing apparatus incorporating a substrate cleaning apparatus according to an embodiment. As shown in FIG. 1, the substrate processing apparatus includes an approximately-rectangular housing 10, and a loading port 12 on which a substrate cassette is placed. The substrate cassette houses therein a large number of substrates, such as wafers. The loading port 12 is disposed adjacent to the housing 10. The loading port 12 can be mounted with an open cassette, a SMIF (Standard Manufacturing Interface) pod, or a FOUP (Front Opening Unified Pod). Each of the SMIF and the FOUP is an airtight container which houses a substrate cassette therein and which, by covering it with a partition wall, can keep its internal environment isolated from an external environment.

In the housing 10, there are disposed a plurality of (four in this embodiment) polishing units 14a, 14b, 14c, 14d, a first cleaning unit 16 and a second cleaning unit 18 each for cleaning a polished substrate, and a drying unit 20 for drying the cleaned substrate. The polishing units 14a through 14d are arranged along a longitudinal direction of the substrate processing apparatus, and the cleaning units 16, 18 and the drying unit 20 are also arranged along the longitudinal direction of the substrate processing apparatus.

A first substrate transfer robot 22 is disposed in an area surrounded by the loading port 12, the polishing unit 14a, and the drying unit 20. Further, a substrate transport unit 24 is disposed parallel to the polishing units 14a through 14d. The first substrate transfer robot 22 receives a substrate, to be polished, from the loading port 12 and transfers the substrate to the substrate transport unit 24, and receives a dried substrate from the drying unit 20 and returns the dried substrate to the loading port 12. The substrate transport unit 24 transports a substrate received from the first substrate transfer robot 22, and transfers the substrate between the polishing units 14a, 14b, 14c, 14d. Each of the polishing units is configured to polish a surface of a substrate, such as a wafer, by bringing the substrate into sliding contact with a polishing surface while supplying a polishing liquid (slurry) onto the polishing surface.

A second substrate transfer robot 26 for transferring a substrate between the cleaning units 16, 18 and the substrate transport unit 24 is provided between the first cleaning unit 16 and the second cleaning unit 18. A third substrate transfer robot 28 for transferring a substrate between the second cleaning unit 18 and the drying unit 20 is provided between these units 18, 20. Further, an operation controller 30 for controlling operations of each unit of the substrate processing apparatus is provided in the housing 10.

In this example, the first cleaning unit 16 is a substrate cleaning apparatus according to an embodiment for cleaning a substrate by scrubbing both a front surface and a rear surface of the substrate with roll cleaning tools, such as roll sponges, in the presence of cleaning liquid. The second cleaning unit 18 is a substrate cleaning apparatus of pen-sponge type. Further, the drying unit 20 is a spin drying apparatus configured to hold a substrate, eject IPA vapor from a moving nozzle to dry the substrate, and rotate the substrate at a high speed to further dry the substrate by a centrifugal force.

The substrate is polished by at least one of the polishing units 14a through 14d. The polished substrate is cleaned by the first cleaning unit 16 and the second cleaning unit 18, and the cleaned substrate is then dried by the drying unit 20.

Figure 2:
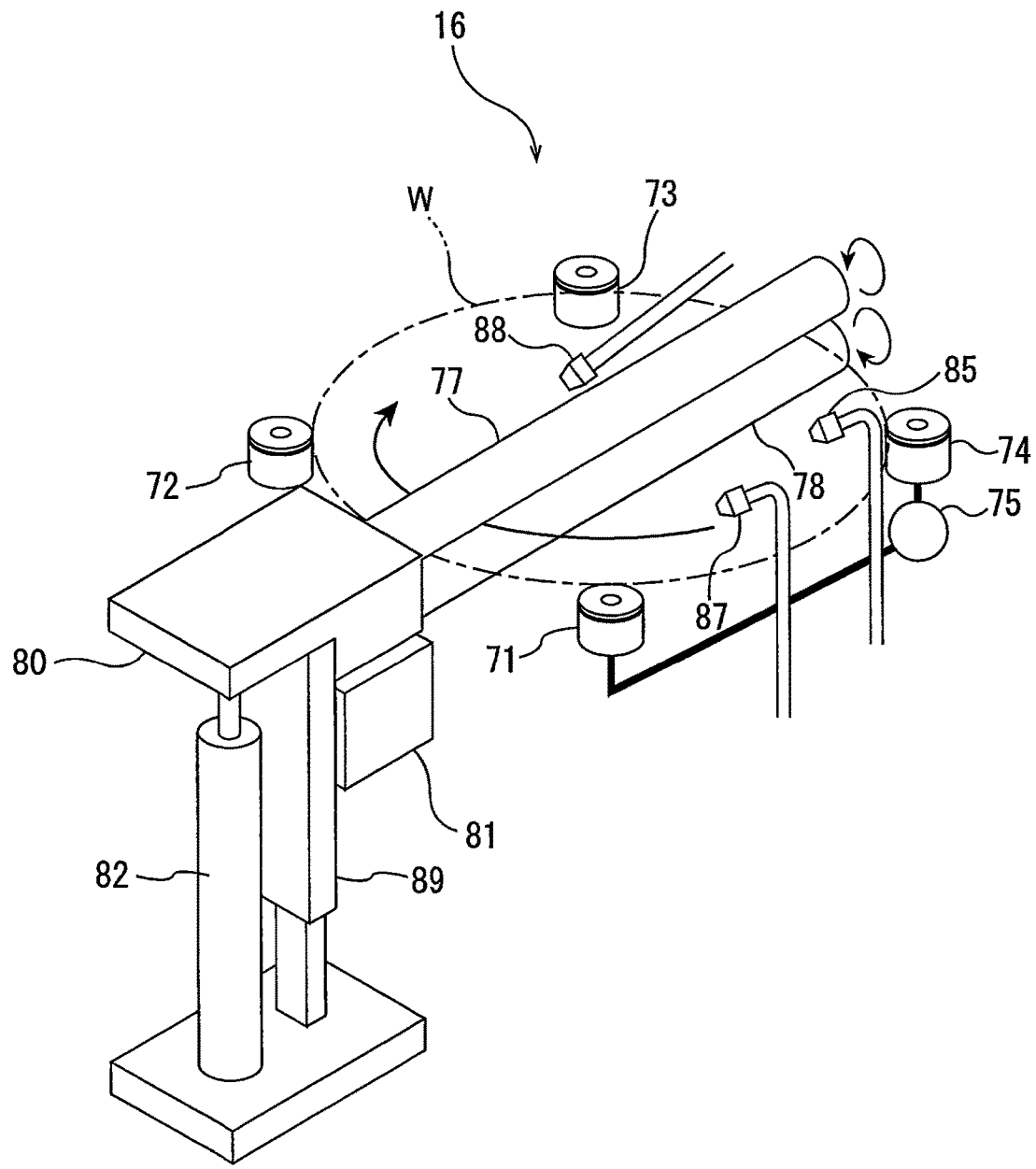
FIG. 2 is a perspective view showing the substrate cleaning apparatus according to the embodiment.

FIG. 2 is a perspective view showing the first cleaning unit (substrate cleaning apparatus) 16. As shown in FIG. 2, the first cleaning unit 16 includes four holding rollers 71, 72, 73, and 74 for horizontally holding and rotating a wafer W, roll sponges (roll cleaning tools) 77, 78 in a column shape which are brought into contact with an upper surface and a lower surface of the wafer W respectively, cleaning-tool rotating mechanisms 80, 81 for rotating these roll sponges 77, 78 about respective own axes, an upper rinsing-liquid supply nozzle 85 for supplying rinsing liquid (for example, pure water) onto the upper surface of the wafer W, and an upper chemical-liquid supply nozzle 87 for supplying chemical liquid onto the upper surface of the wafer W. Although not shown in the drawing, the first cleaning unit 16 further includes a lower rinsing-liquid supply nozzle for supplying rinsing liquid (for example, pure water) onto the lower surface of the wafer W, and a lower chemical-liquid supply nozzle for supplying chemical liquid onto the lower surface of the wafer W. In this specification, the chemical liquid and the rinsing liquid may be collectively referred to as cleaning liquid, and the upper chemical-liquid supply nozzle 87 and the rinsing-liquid supply nozzle 85 may be collectively referred to as cleaning-liquid supply nozzle.

The holding rollers 71, 72, 73, 74 are configured to be movable in directions toward and away from the wafer W by a non-illustrated actuator (e.g., an air cylinder). Of the four holding rollers, the two holding rollers 71, 74 are coupled to a substrate rotating mechanism 75, which rotates the holding rollers 71, 74 in the same direction. While the four holding rollers 71, 72, 73, 74 are holding the wafer W, the two holding rollers 71, 74 are rotated to thereby rotate the wafer W about its own axis. In this embodiment, a substrate holder for holding and rotating the wafer W is constituted by the holding rollers 71, 72, 73, 74 and the substrate rotating mechanism 75.

The cleaning-tool rotating mechanism 80 for rotating the upper roll sponge 77 is mounted to a guide rail 89 that guides a vertical movement of the cleaning-tool rotating mechanism 80. The cleaning-tool rotating mechanism 80 is supported by a vertically-moving mechanism 82 so that the cleaning-tool rotating mechanism 80 and the upper roll sponge 77 are moved in the vertical direction by the vertically-moving mechanism 82. Although not shown in the drawings, the cleaning-tool rotating mechanism 81 for rotating the lower roll sponge 78 is also mounted to a guide rail, and the cleaning-tool rotating mechanism 81 and the lower roll sponge 78 are moved in the vertical direction by a vertically-moving mechanism. The vertically-moving mechanism may be a motor-drive mechanism using a ball screw, an air cylinder, or the like. When cleaning the wafer W, the roll sponges 77, 78 are moved in the directions as to come closer to each other until the roll sponges 77, 78 are brought into contact with the upper and lower surfaces of the wafer W respectively. Instead of the roll sponge, a roll brush may be used as the roll cleaning tool.

Figure 3:
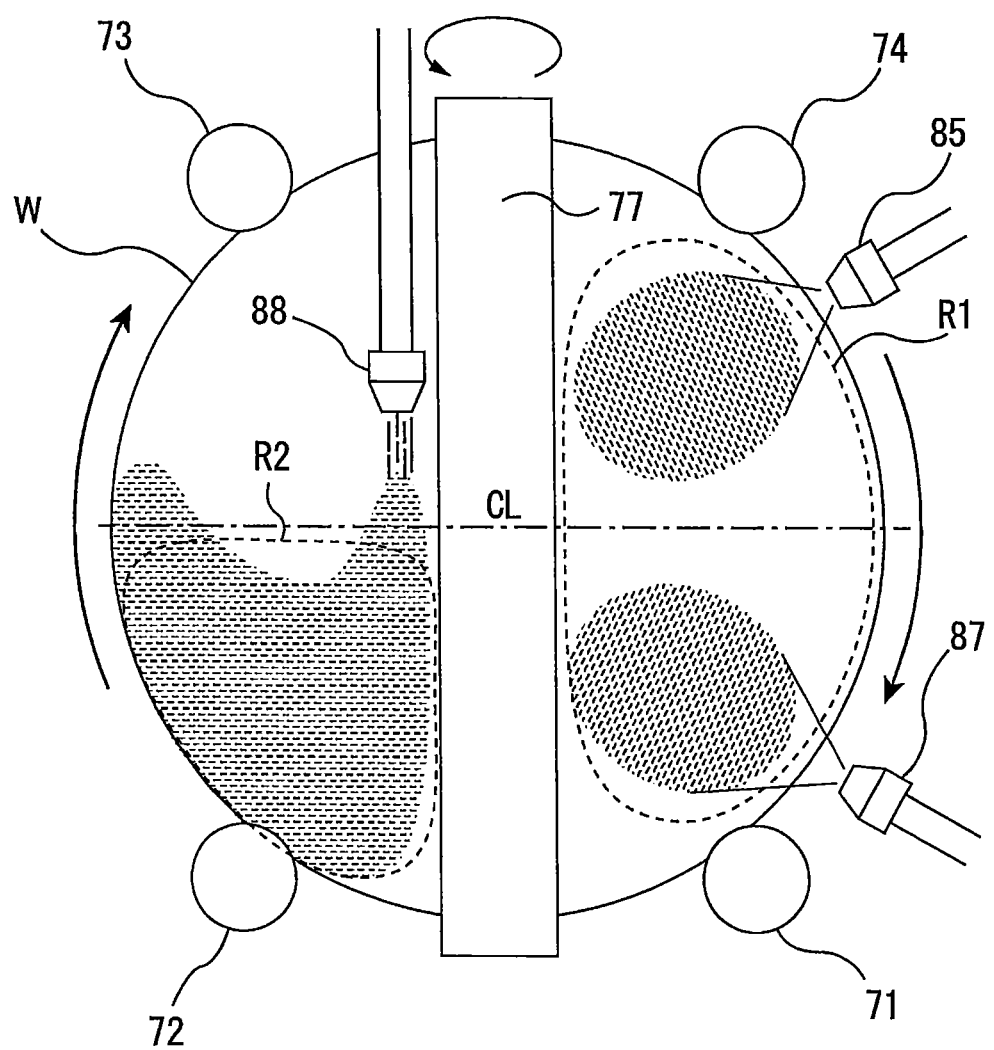
FIG. 3 is a top view showing the substrate cleaning apparatus shown in FIG. 2.

FIG. 3 is a top view showing the substrate cleaning apparatus shown in FIG. 2. A fluid supply nozzle 88 for supplying pure water onto the upper surface of the wafer W is disposed above the wafer W held by the holding rollers 71, 72, 73, 74. The fluid supply nozzle 88 is disposed adjacent to the roll sponge 77 such that the pure water is supplied from a central side toward a peripheral side of the wafer W. Specifically, the pure water supplied from the fluid supply nozzle 88 flows on the wafer W from the central side toward the peripheral side of the wafer W along the roll sponge 77. The fluid supply nozzle 88 may supply chemical liquid, instead of the pure water.

The fluid supply nozzle 88 is disposed at an opposite side of the chemical-liquid supply nozzle 87 and the rinsing-liquid supply nozzle 85 (i.e., the cleaning-liquid supply nozzles) with respect to the roll sponge 77. As shown in FIG. 3, the chemical liquid and the rinsing liquid (i.e., the cleaning liquid) are supplied onto a first region R1 of the upper surface of the rotating wafer W, while the pure water is supplied onto a second region R2 of the upper surface of the rotating wafer W. The first region R1 and the second region R2 are defined as two regions located at both sides of the roll sponge 77. Specifically, the second region R2 is located at the opposite side of the first region R1 with respect to the roll sponge 77.

The chemical liquid and the rinsing liquid, supplied onto the first region R1 of the wafer W, are brought into contact with the roll sponge 77 as the wafer W is rotated, and are then carried to the second region R2. The chemical liquid and the rinsing liquid that have been carried to the second region R2 contain cleaning debris, such as particles, which are generated by scrub-cleaning of the wafer W. The pure water, supplied from the fluid supply nozzle 88, forms a flow toward the outside of the wafer W in the second region R2. This flow carries away the chemical liquid and the rinsing liquid from the wafer W. In this manner, the chemical liquid and the rinsing liquid (i.e., the cleaning liquid) that have been used for scrub-cleaning of the wafer W are removed quickly from the wafer W by the pure water. As a result, the cleaning effect of the chemical liquid and the rinsing liquid can be improved. Further, since an amount of the cleaning debris accumulated in the roll sponge 77 is reduced, a lifetime of the roll sponge 77 can be remarkably increased.

Figure 4:
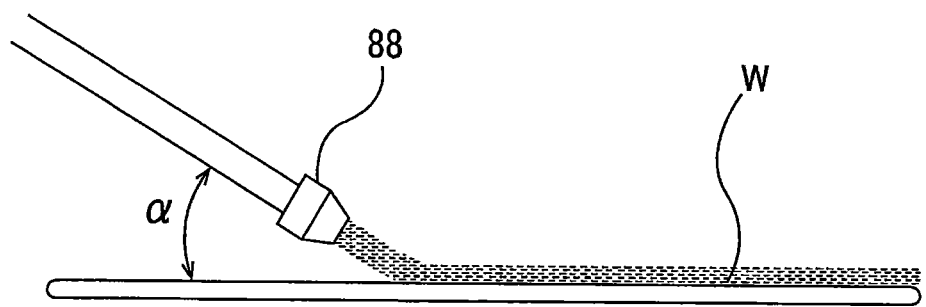
FIG. 4 is a side view of a fluid supply nozzle.

FIG. 4 is a side view of the fluid supply nozzle 88. As shown in FIG. 4, the fluid supply nozzle 88 is inclined with respect to the surface of the wafer W. A supply angle of the pure water (represented by a symbol a in FIG. 4) is preferably small to some degree in order to prevent the pure water from being scattered when the pure water collides with the wafer W and in order to form a strong flow of the pure water toward the outside of the wafer W. Specifically, the supply angle of the pure water with respect to the surface of the wafer W is preferably not less than 5 degrees and not more than 60 degrees, and more preferably not less than 5 degrees and not more than 30 degrees.

To ensure the effect of removing the cleaning liquid (the chemical liquid and the rinsing liquid), a flow rate of the pure water is preferably in a range of 500 mL/min to 2 L/min. If the flow rate of the pure water is high, a supply direction of the pure water as viewed from above the wafer W is not necessarily parallel to the roll sponge 77. In other words, the supply direction of the pure water as viewed from above the wafer W may be inclined with respect to the roll sponge 77.

To ensure the effect of removing the cleaning liquid (the chemical liquid and the rinsing liquid), the second region R2 to which the pure water is supplied is preferably downstream of the roll sponge 77 with respect to a rotational direction of the wafer W, as shown in FIG. 3. The pure water is supplied to the second region R2 defined at this location, so that a period of time long enough to enable the flow of the pure water to carry away the cleaning liquid from the wafer W can be ensured.

As shown in FIG. 3, it is preferable that the fluid supply nozzle 88 form the flow of the pure water on the surface of the wafer W such that the flow of the pure water crosses a center line CL of the wafer W which is perpendicular to a longitudinal direction of the roll sponge 77. The pure water flowing in such a manner can carry away the cleaning liquid existing on a central region of the wafer W.

Next, a process of cleaning the wafer W will be described. First, the wafer W is rotated about its own axis by the holding rollers 71, 72, 73, 74. Next, the upper chemical-liquid supply nozzle 87 and the lower chemical-liquid supply nozzle (not shown) supply the chemical liquid onto the upper surface and the lower surface of the wafer W, respectively. In this state, the roll sponges 77, 78 are brought into sliding contact with the upper and lower surfaces of the wafer W while being rotated about their horizontally-extending axes, thereby scrub-cleaning the upper and lower surfaces of the wafer W. Each of the roll sponges 77, 78 has a length longer than a diameter (or a width) of the wafer W, so that the roll sponges 77, 78 can contact the upper and lower surfaces of the wafer W in their entirety. While the chemical liquid is being supplied onto the wafer W, the pure water is supplied onto the wafer W from the fluid supply nozzle 88. The chemical liquid that has been used in the scrub-cleaning is removed quickly from the wafer W by the flow of the pure water formed on the second region R2 of the wafer W.

After the scrub-cleaning, pure water as the rinsing liquid is supplied onto the upper surface and the lower surface of the rotating wafer W while the roll sponges 77, 78 are in sliding contact with the upper and lower surfaces of the wafer W, whereby the wafer W is rinsed. While the rinsing liquid is being supplied onto the wafer W, the pure water is supplied from the fluid supply nozzle 88 onto the wafer W as well. The rinsing liquid that has been used in rinsing of the wafer W is removed quickly from the wafer W by the flow of the pure water that is formed on the second region R2 of the wafer W.

In order to dilute the chemical liquid with the rinsing liquid, the chemical liquid and the rinsing liquid may be supplied simultaneously onto the first region R1 of the wafer W. In this case also, the pure water is supplied from the fluid supply nozzle 88 onto the second region R2 of the wafer W while the chemical liquid and the rinsing liquid are supplied onto the wafer W.

Figure 5:
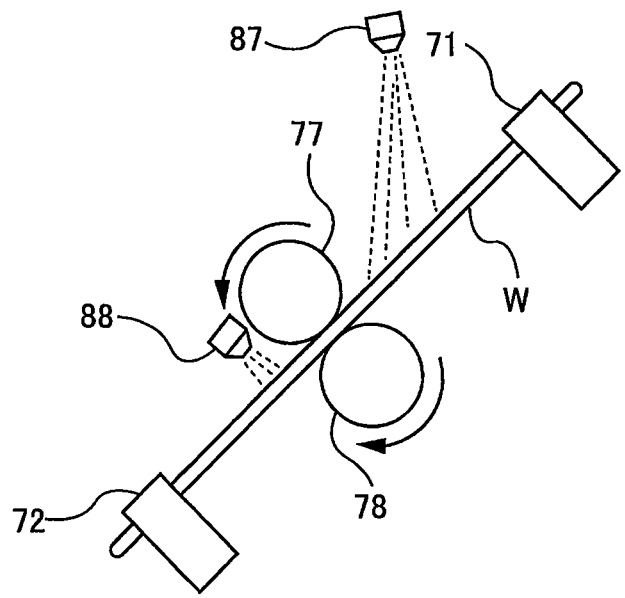
FIG. 5 is a view showing an example in which a wafer is inclined.
Figure 6:
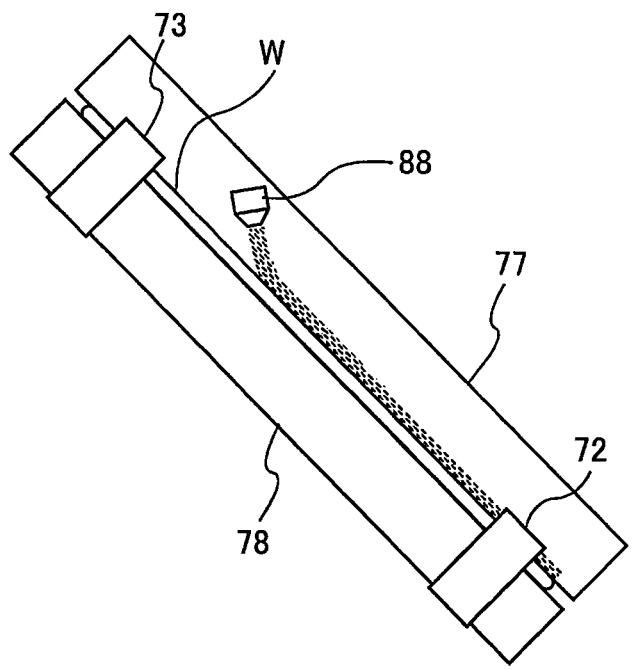
FIG. 6 is a view showing another example in which a wafer is inclined.

As shown in FIG. 5, the holding rollers 71, 72, 73, 74 may hold and rotate the wafer W in such a state that the surface of the wafer W is inclined downwardly from the first region R1 toward the second region R2. Alternatively, as shown in FIG. 6, the holding rollers 71, 72, 73, 74 may hold and rotate the wafer W in such a state that the surface of the wafer W is inclined downwardly along the flow direction of the pure water discharged from the fluid supply nozzle 88. According to these examples shown in FIGS. 5 and 6, the cleaning liquid is removed more quickly from the surface of the wafer W by the own weight of the cleaning liquid and the centrifugal force.

Figure 7:
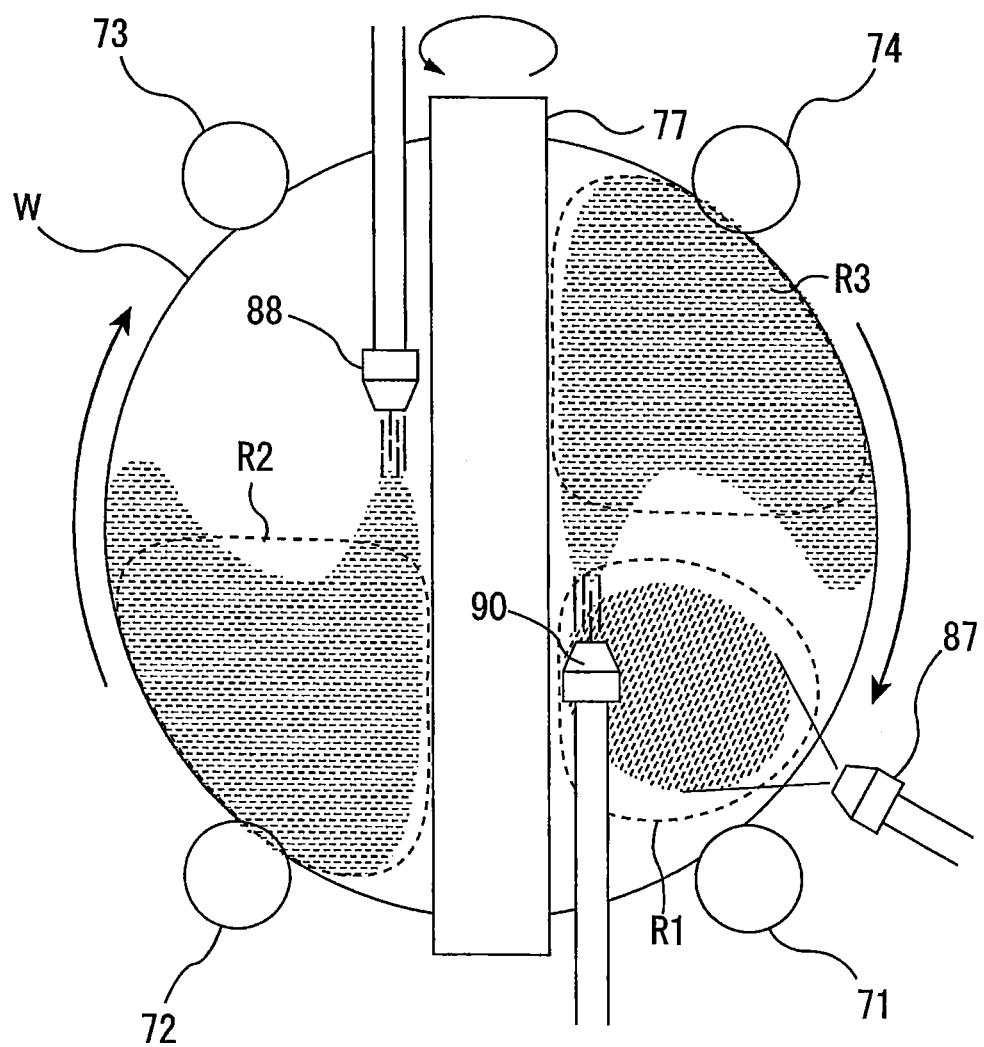
FIG. 7 is a top view showing another embodiment of the substrate cleaning apparatus.

As shown in FIG. 7, a fluid supply nozzle 90 may be provided for supplying pure water onto a third region R3 of the wafer W. The third region R3 is located at the same side as the first region R1 with respect to the roll sponge 77, and is located downstream of the roll sponge 77 with respect to the rotational direction of the wafer W. Further, the third region R3 is located upstream of the first region R1 with respect to the rotational direction of the wafer W. The two fluid supply nozzles 88, 90 are arranged symmetrically with respect to the center of the wafer W. The second fluid supply nozzle 90 is arranged so as to supply the pure water from the central side toward the peripheral side of the wafer W, as with the first fluid supply nozzle 88. In the embodiment shown in FIG. 7, the rinsing-liquid supply nozzle may be omitted. The fluid supply nozzle 90 may supply chemical liquid, instead of the pure water.

Figure 8:
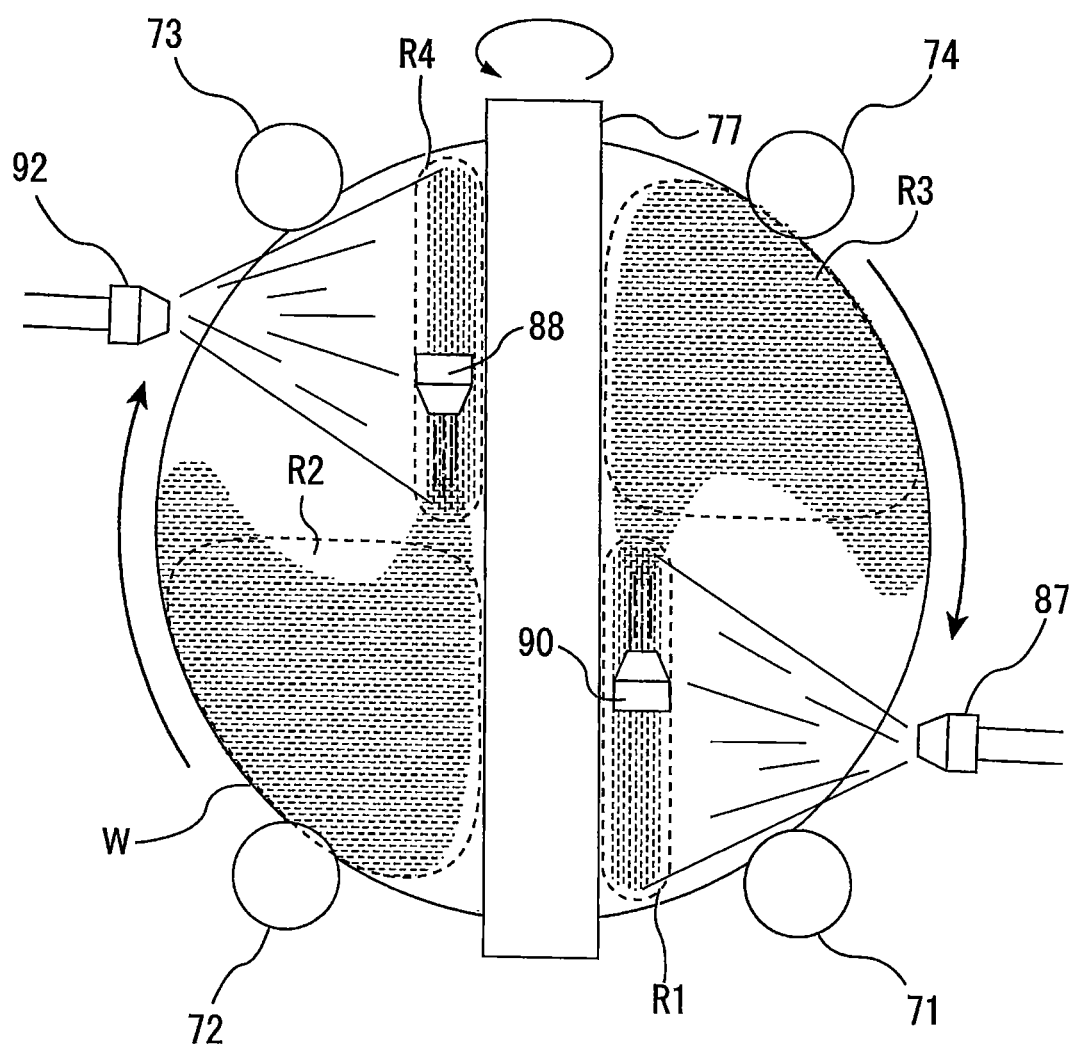
FIG. 8 is a top view showing still another embodiment of the substrate cleaning apparatus.

FIG. 8 is a view showing still another embodiment. The embodiment shown in FIG. 8 differs from the embodiment shown in FIG. 7 in that a flat nozzle configured to form a flat fan-shaped jet flow is used as the chemical-liquid supply nozzle 87 and that a chemical-liquid supply nozzle 92 is provided for supplying chemical liquid onto a fourth region R4. The fourth region R4 is located at the same side as the second region R2 with respect to the roll sponge 77, and is located upstream of the roll sponge 77 with respect to the rotational direction of the wafer W. In the embodiment shown in FIG. 8, the rinsing-liquid supply nozzle is not provided.

The flat nozzle is suitable for supplying liquid to a linear narrow region. A flat nozzle is also used as the chemical-liquid supply nozzle 92 for supplying the chemical liquid onto the fourth region R4. In this embodiment, as shown in FIG. 8, the first region R1 onto which the chemical liquid is supplied from the chemical-liquid supply nozzle 87 is located upstream of the roll sponge 77 with respect to the rotational direction of the wafer W, and is a narrow region extending linearly along the roll sponge 77. The fourth region R4 onto which the chemical liquid is supplied from the chemical-liquid supply nozzle 92 is also located upstream of the roll sponge 77 with respect to the rotational direction of the wafer W, and is a narrow region extending linearly along the roll sponge 77.

Since the flat nozzle is used as the chemical-liquid supply nozzles 87, 92, the chemical liquid can be supplied onto the linear regions extending along the longitudinal direction of the roll sponge 77. The chemical liquid that has been supplied onto such regions is brought into contact with the roll sponge 77 uniformly as the wafer W is rotated, thereby achieving uniform cleaning of the wafer. The chemical-liquid supply nozzles 87, 92 may be of any type other than the flat nozzle, so long as the chemical-liquid supply nozzles 87, 92 can supply the chemical liquid onto a linear region extending along the longitudinal direction of the roll sponge 77. For example, a slit nozzle having a slit-shaped liquid outlet or a multi-aperture nozzle having multiple liquid outlets arranged linearly may be used as the chemical-liquid supply nozzles 87, 92.

Figure 9:
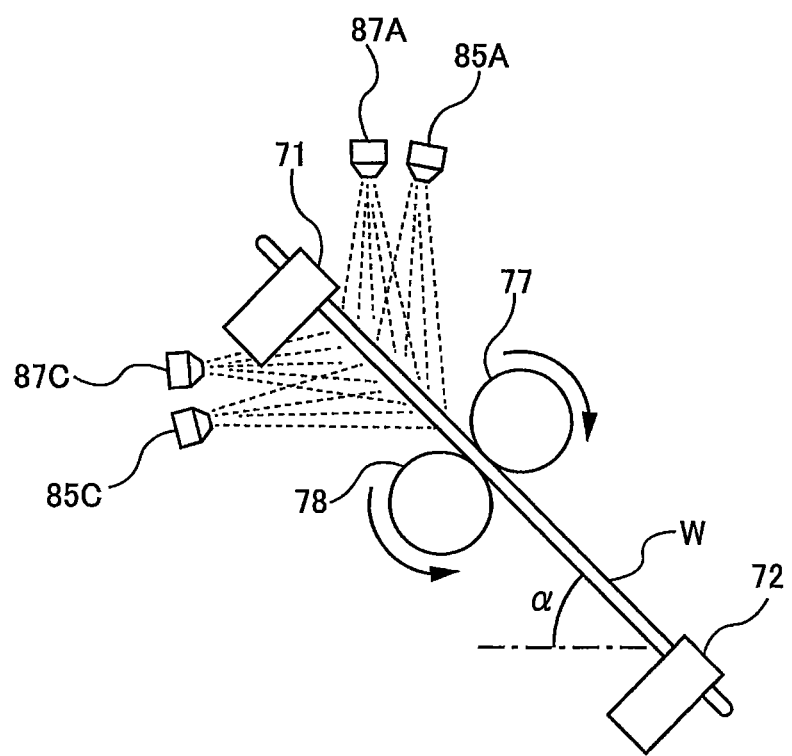
FIG. 9 is a side view showing still another embodiment of the substrate cleaning apparatus.
Figure 10:
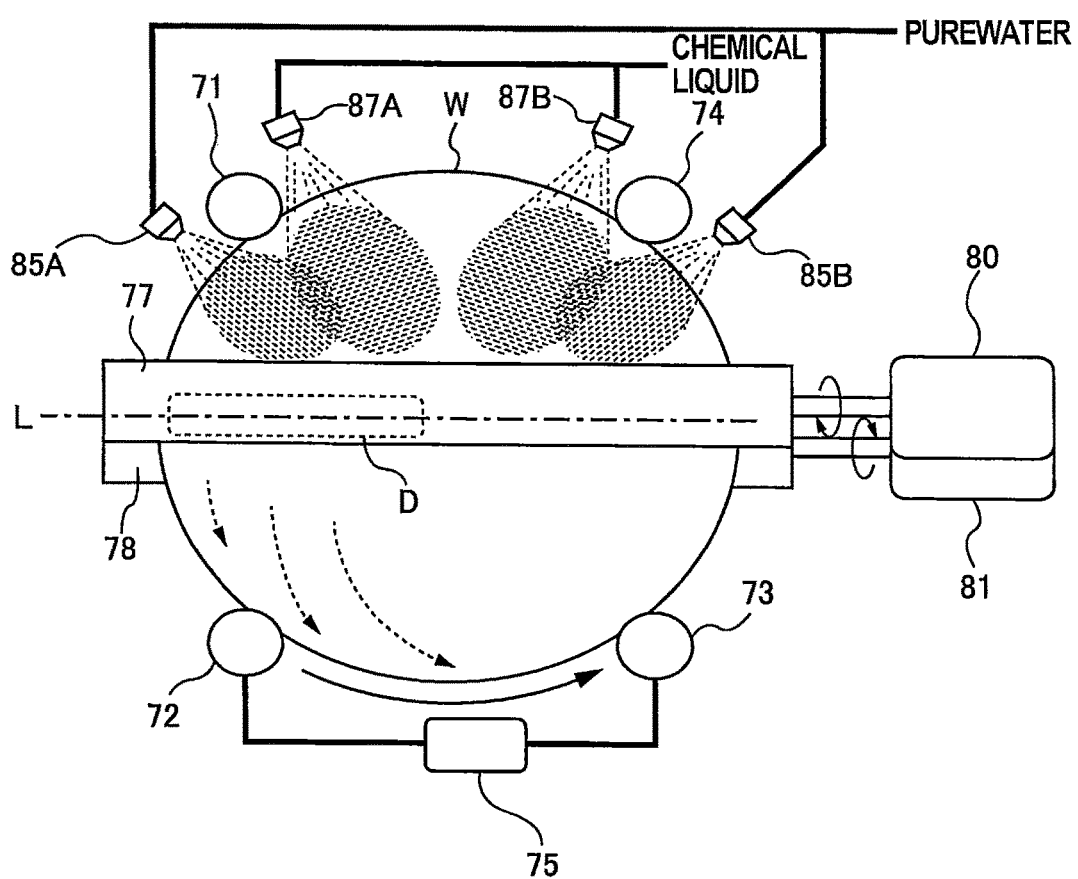
FIG. 10 is a front elevational view of the substrate cleaning apparatus shown in FIG. 9.

FIG. 9 is a side view showing still another embodiment of the first cleaning unit (substrate cleaning apparatus) 16, and FIG. 10 is a front elevational view of the first cleaning unit 16 shown in FIG. 9. The first cleaning unit 16 includes four holding rollers 71, 72, 73, 74 for holding and rotating a wafer W, roll sponges (roll cleaning tools) 77, 78 in a column shape which are brought into contact with an upper surface and a lower surface of the wafer W respectively, cleaning-tool rotating mechanism 80 for rotating the upper roll sponge 77 about its own axis, cleaning-tool rotating mechanism 81 for rotating the lower roll sponge 78 about its own axis, upper rinsing-liquid supply nozzles 85A, 85B for supplying rinsing liquid (for example, pure water) onto the upper surface of the wafer W, and upper chemical-liquid supply nozzles 87A, 87B for supplying chemical liquid onto the upper surface of the wafer W.

Further, the first cleaning unit 16 includes a lower rinsing-liquid supply nozzle 85C for supplying rinsing liquid (for example, pure water) onto the lower surface of the wafer W, and a lower chemical-liquid supply nozzle 87C for supplying chemical liquid onto the lower surface of the wafer W. In this specification, the chemical liquid and the rinsing liquid may be collectively referred to as cleaning liquid, and the chemical-liquid supply nozzles 87A through 87C and the rinsing-liquid supply nozzles 85A through 85C may be collectively referred to as cleaning-liquid supply nozzle. An incident angle of the cleaning liquid from each of the cleaning-liquid supply nozzles with respect to the wafer surface is an acute angle. Specifically, each of the cleaning-liquid supply nozzles is arranged at an angle as to form a downward flow of the cleaning liquid on the wafer surface.

The holding rollers 71, 72, 73, 74 are configured to be movable in directions toward and away from the water W by a non-illustrated actuator (e.g., an air cylinder). Of the four holding rollers, the two holding rollers 72, 73 are coupled to substrate rotating mechanism 75, which rotates the holding rollers 72, 73 in the same direction. While the four holding rollers 71, 72, 73, 74 are holding the peripheral portion of the wafer W, the two holding rollers 72, 73 are rotated to thereby rotate the wafer W about its own axis.

In this embodiment, a substrate holder for holding and rotating the wafer W is constituted by the holding rollers 71, 72, 73, 74 and the substrate rotating mechanism 75. The substrate rotating mechanism 75 is constituted by a motor, a belt for transmitting a driving force of the motor to the holding rollers 72, 73, and other components. Although the substrate rotating mechanism 75 is coupled to the two holding rollers 72, 73 in this embodiment, the substrate rotating mechanism 75 may be coupled to one of the holding rollers 71, 72, 73, 74, or may be coupled to three or more holding rollers.

The axes of the holding rollers 71, 72, 73, 74 are inclined with respect to the vertical direction. As a result, the wafer W held by the holding rollers 71, 72, 73, 74 is inclined with respect to a horizontal plane at a predetermined angle $\alpha$. The wafer W is held by the holding rollers 71, 72, 73, 74 with its device surface (i.e., a surface on which devices are formed) facing upward.

The upper chemical-liquid supply nozzles 87A, 87B supply the chemical liquid and the upper rinsing-liquid supply nozzles 85A, 85B supply the rinsing liquid onto an upper region of the upper surface of the inclined wafer W. Similarly, the lower chemical-liquid supply nozzle 87C supplies the chemical liquid and the lower rinsing-liquid supply nozzle 85C supplies the rinsing liquid onto an upper region of the lower surface of the inclined wafer W. The chemical liquid and the rinsing liquid that have been supplied to the wafer W flow downwardly on the wafer W by their own weights to contact the roll sponges 77, 78. The upper region of the upper surface of the wafer W is a region above a center line (represented by a symbol L in FIG. 10) extending horizontally on the upper surface of the wafer W, and the upper region of the lower surface of the wafer W is a region above a center line (not shown) extending horizontally on the lower surface of the wafer W.

As indicated by arrows in FIG. 9, the roll sponges 77, 78 are rotated by the cleaning-tool rotating mechanisms 80, 81 in respective directions as to raise the wafer W held by the holding rollers 71, 72, 73, 74. An upward force transmitted from the rotating roll sponges 77, 78 to the wafer W is supported by the two upper holding rollers 71, 74. The number and arrangement of holding rollers constituting the substrate holder is not limited to the embodiment shown in FIGS. 9 and 10. For example, three holding rollers may be arranged around the wafer W, and one of the three holding rollers may be located so as to support the upward force. The number of holding rollers is at least three, preferably four or more.

The roll sponges 77, 78 are configured to be moved by a non-illustrated actuator in directions as to contact the wafer W and move away from the wafer W. A motor-drive mechanism using a ball screw, an air cylinder, or the like is used as the actuator. When cleaning the wafer W, the roll sponges 77, 78 are moved in respective directions as to come closer to each other until the roll sponges 77, 78 are brought into contact with the upper and lower surfaces of the wafer W respectively. Instead of the roll sponge, a roll brush may be used as the roll cleaning tool.

Next, a process of cleaning the wafer W will be described. First, the wafer W is rotated about its own axis by the holding rollers 71, 72, 73, 74. Next, the upper chemical-liquid supply nozzles 87A, 87B and the lower chemical-liquid supply nozzle 87C supply chemical liquid onto the upper surface and the lower surface of the wafer W, respectively. In this state, the roll sponges 77, 78 are brought into sliding contact with the upper and lower surfaces of the wafer W while being rotated about their horizontally-extending axes, thereby scrub-cleaning the upper and lower surfaces of the wafer W. Each of the roll sponges 77, 78 has a length longer than the diameter (or the width) of the wafer W, so that the roll sponges 77, 78 can contact the upper and lower surfaces of the wafer W in their entirety.

After the scrub-cleaning, the rinsing-liquid supply nozzles 85A through 85C supply the rinsing liquid onto the upper surface and the lower surface of the rotating wafer W while the roll sponges 77, 78 are placed in sliding contact with the upper and lower surfaces of the wafer W, whereby the wafer W is rinsed. During rinsing of the wafer W, the roll sponges 77, 78 may be separated away from the upper and lower surfaces of the wafer W. In order to dilute the chemical liquid with the rinsing liquid when scrub-cleaning the wafer W, the chemical liquid and the rinsing liquid may be simultaneously supplied onto the wafer W.

The surface of the wafer W is cleaned by the sliding contact between the roll sponge 77 and the wafer W in the presence of the cleaning liquid. Therefore, a region where the highest cleaning effect is achieved on the surface of the wafer W is the region D (see FIG. 10) where a relative velocity between the roll sponge 77 and the wafer W is maximized. The cleaning liquid (i.e., the chemical liquid and/or the rinsing liquid) existing on the region D is moved to a lower region of the upper surface of the wafer W as the wafer W is rotated. Since the wafer W is inclined at the predetermined angle α, the cleaning liquid is removed quickly from the wafer W by the own weight of the cleaning liquid and the centrifugal force. Accordingly, cleaning debris, such as particles, contained in the cleaning liquid is not attached to the roll sponge 77, and furthermore, fresh cleaning liquid is not diluted with the used cleaning liquid. Therefore, the lifetime of the roll sponge 77 can be increased, and furthermore, the cleaning effect on the wafer W can be improved. These effects hold true for the lower surface of the wafer W.

The angle α of the wafer W with respect to the horizontal plane is larger than 0 degree and not more than 90 degrees, preferably not less than 30 degrees and not more than 90 degrees, and more preferably not less than 30 degrees and not more than 80 degrees.

Figure 11:
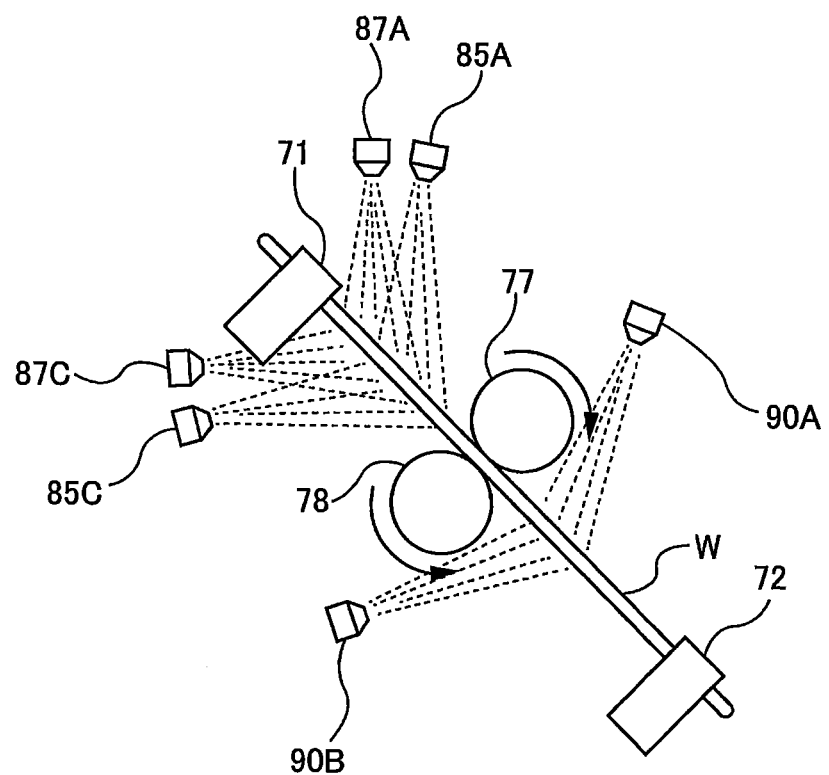
FIG. 11 is a side view showing still another embodiment of the substrate cleaning apparatus.
Figure 12:
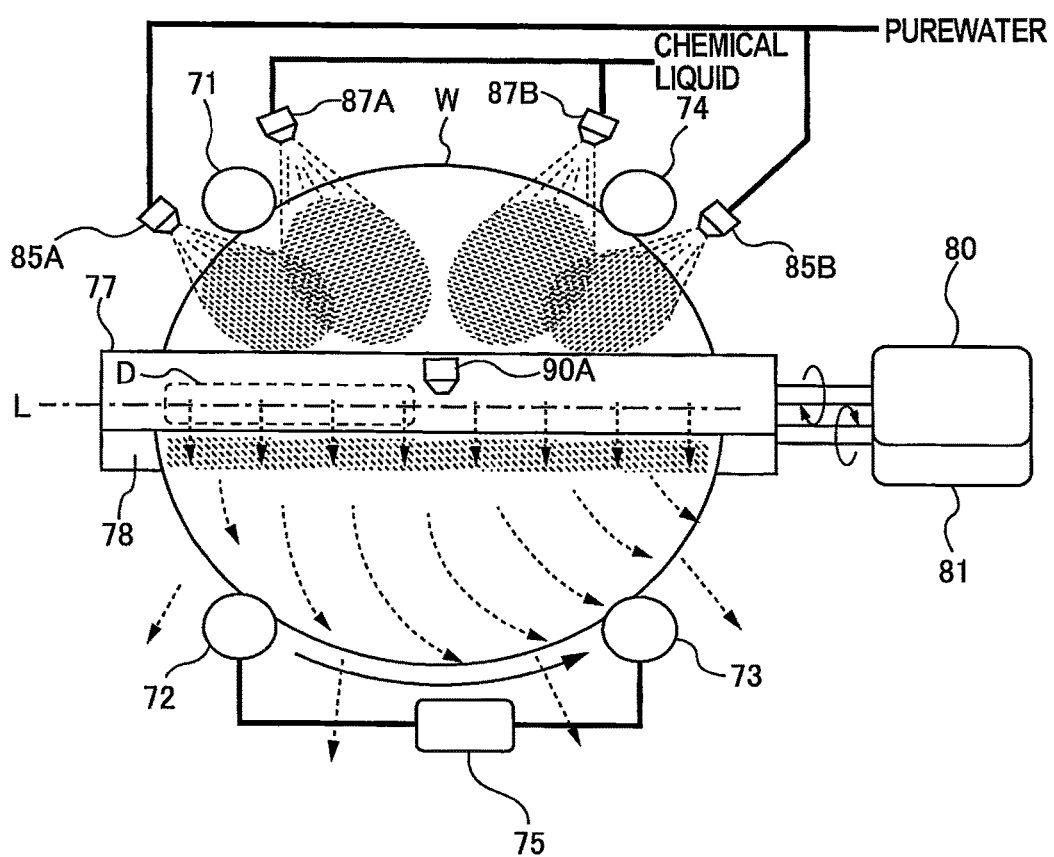
FIG. 12 is a front elevational view of the substrate cleaning apparatus shown in FIG. 11.

In order to certainly remove the cleaning liquid (i.e., the chemical liquid and/or the rinsing liquid), containing the cleaning debris, from the wafer W, it is preferable, as shown in FIGS. 11 and 12, to provide an upper fluid supply nozzle 90A for supplying pure water onto a lower region of the upper surface of the wafer W and a lower fluid supply nozzle 90B for supplying pure water onto a lower region of the lower surface of the wafer W. The fluid supply nozzles 90A, 90B are configured to supply the pure water onto regions parallel to the roll sponges 77, 78, respectively. Flat nozzles are used as the fluid supply nozzles 90A, 90B. However, the fluid supply nozzles 90A, 90B may be of any type other than the flat nozzle so long as the fluid supply nozzles 90A, 90B can supply the pure water onto the linear regions extending along the longitudinal direction of the roll sponges 77, 78. For example, a slit nozzle having a slit-shaped liquid outlet or a multi-aperture-nozzle having multiple liquid outlets arranged linearly may be used as the fluid supply nozzles 90A, 90B. The fluid supply nozzles 90A, 90B may supply chemical liquid, instead of the pure water.

The fluid supply nozzles 90A, 90B are inclined with respect to the direction perpendicular to the wafer surface. More specifically, each of the fluid supply nozzles 90A, 90B is arranged at an angle as to form a downward flow of the pure water on the wafer surface. The pure water is supplied onto the respective regions that are located right below the roll sponges 77, 78, and flows downwardly on the lower regions of the upper and lower surfaces of the wafer W. The lower region of the upper surface of the wafer W is a region below the center line (represented by the symbol L in FIG. 12) extending horizontally on the upper surface of the wafer W, and the lower region of the lower surface of the wafer W is a region below the center line (not shown) extending horizontally on the lower surface of the wafer W.

The cleaning liquid (i.e., the chemical liquid and/or the rinsing liquid) existing on the regions D is moved to the respective lower regions of the upper surface and the lower surface of the wafer W, as the wafer W is rotated. As shown in FIG. 12, the cleaning liquid is removed quickly from the wafer W by the own weight of the cleaning liquid, the centrifugal force, and the flows of the pure water.

Figure 13:
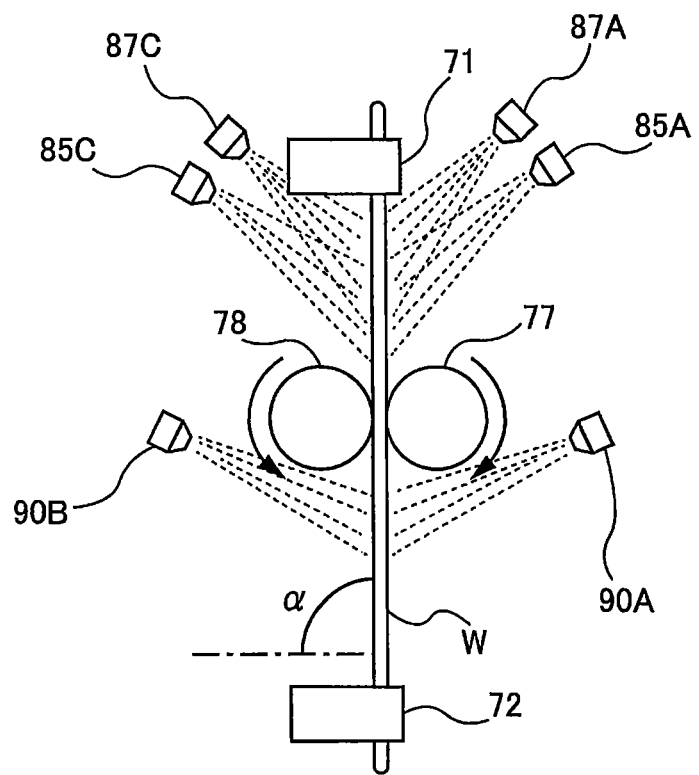
FIG. 13 is a side view showing the substrate cleaning apparatus configured to hold a wafer in a vertical position.
Figure 14:
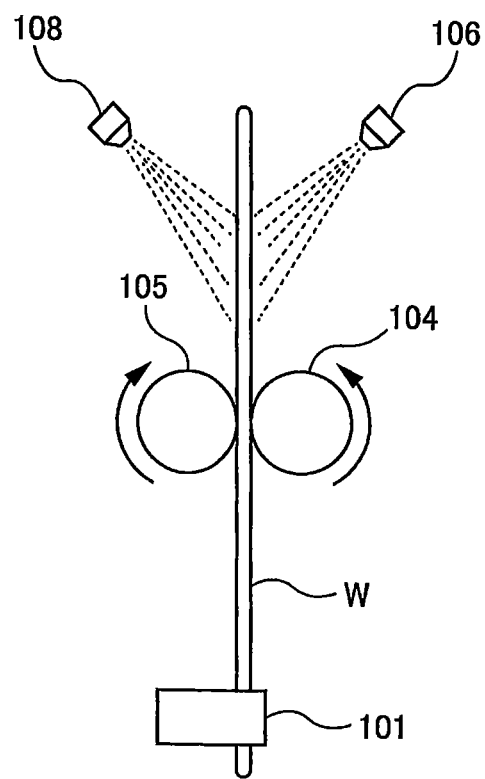
FIG. 14 is a side view showing a conventional substrate cleaning apparatus.
Figure 15:
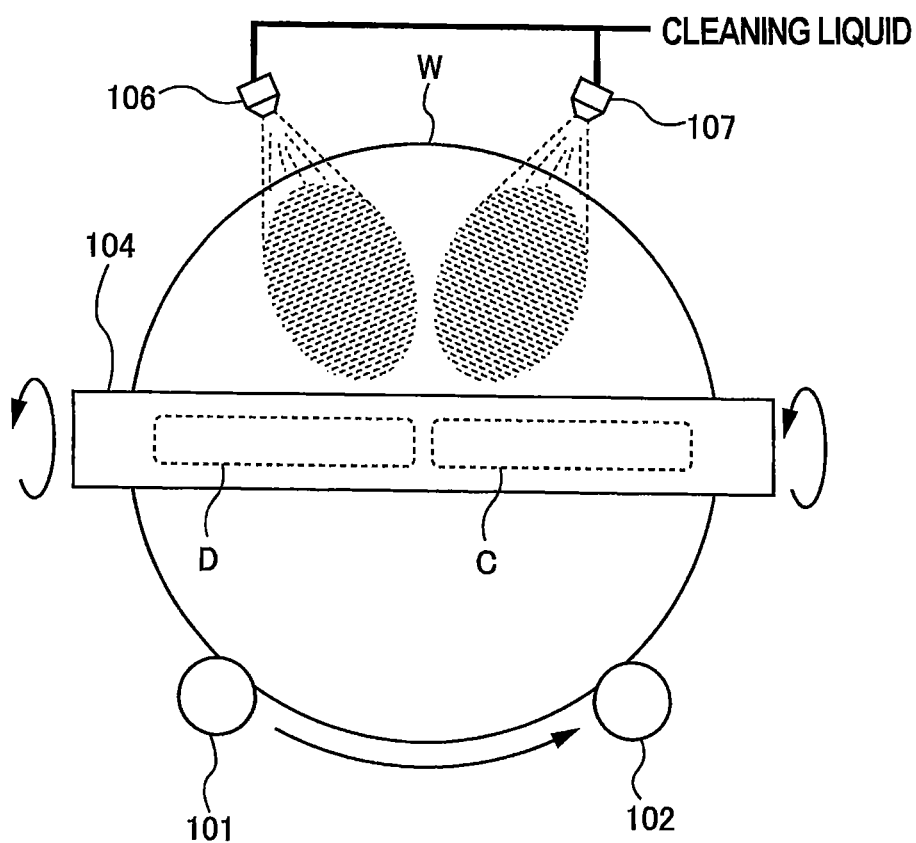
FIG. 15 is a front view of the conventional substrate cleaning apparatus shown in FIG. 14.

FIG. 13 is a side view showing the substrate cleaning apparatus configured to hold the wafer W in the vertical position. In the embodiment shown in FIG. 13, the angle α of the wafer W held by the holding rollers 71, 72, 73, 74 with respect to the horizontal plane is 90 degrees. The fluid supply nozzles 90A, 90B are disposed adjacent to the roll sponges 77, 78, respectively. The fluid supply nozzles 90A, 90B supply the fluid, constituted by the pure water or the chemical liquid, onto the lower regions of the both surfaces of the wafer W, so that particles remaining on the surfaces of the wafer W can be rinsed off before the particles contact the roll sponges 77, 78 again.

Although certain embodiments of the present invention have been described, it should be understood that the present invention is not limited to the specific embodiments described above, and various changes and modifications may be made without departing from the scope of the technical concept.

What is claimed is:

1. A substrate cleaning apparatus, comprising:
    a substrate holder configured to hold a substrate and rotate the substrate about a rotational axis;
    a roll cleaning tool configured to be placed in sliding contact with the substrate to thereby clean the substrate; and
    a cleaning-tool rotating device coupled to the roll cleaning tool;
    a vertically-moving device coupled to the cleaning-tool rotating device, the vertically-moving device being configured to change a vertical position of the roll cleaning tool toward the substrate held by the substrate holder and keep the vertical position of the roll cleaning tool while cleaning the substrate;
    a cleaning-liquid supply nozzle configured to supply cleaning liquid onto a first region of the substrate;
    a fluid supply nozzle arranged in parallel with a longitudinal direction of the roll cleaning tool as viewed from an extending direction of the rotational axis, the fluid supply nozzle being configured to supply fluid, which is constituted by pure water or chemical liquid, onto a second region of the substrate, the cleaning-liquid supply nozzle being located at one side of the roll cleaning tool, while the fluid supply nozzle being located at an opposite side of the roll cleaning tool beside the roll cleaning tool, the fluid supply nozzle being located at a position to form a flow of the fluid along the longitudinal direction of the roll cleaning tool at the second region located at an opposite side of the substrate from the first region across the roll cleaning tool.

2. The substrate cleaning apparatus according to claim 1, wherein the second region is a region downstream of the roll cleaning tool with respect to a rotational direction of the substrate.

3. The substrate cleaning apparatus according to claim 1, wherein the supply direction of the fluid is a direction from the central side toward the peripheral side of the substrate along the roll cleaning tool.

4. The substrate cleaning apparatus according to claim 1, wherein a supply angle of the fluid with respect to a surface of the substrate is in a range of 5 degrees to 60 degrees.

5. The substrate cleaning apparatus according to claim 1, wherein the first region of the substrate is located upstream of the roll cleaning tool with respect to a rotational direction of the substrate, and extends linearly along the roll cleaning tool.

6. The substrate cleaning apparatus according to claim 1, wherein the fluid supply nozzle is arranged so as to form a flow of the fluid on a surface of the substrate such that the flow of the fluid crosses a center line of the substrate which is perpendicular to a longitudinal direction of the roll cleaning tool.

7. The substrate cleaning apparatus according to claim 1, wherein the substrate holder is configured to rotate the substrate in such a state that the substrate is inclined at a predetermined angle with respect to a horizontal plane.

8. The substrate cleaning apparatus according to claim 7, further comprising:
a cleaning-tool rotating mechanism configured to rotate the roll cleaning tool in a direction as to raise the substrate.

9. The substrate cleaning apparatus according to claim 8, wherein the substrate holder comprises at least three holding rollers configured to hold a peripheral portion of the substrate, and a substrate rotating mechanism configured to rotate at least one of the holding rollers,
wherein at least one of the holding rollers is arranged at a position as to support an upward force transmitted from the roll cleaning tool to the substrate.

10. The substrate cleaning apparatus according to claim 9, wherein a front end of the fluid supply nozzle is located closer to the rotational axis than to the at least three holding rollers.

11. The substrate cleaning apparatus according to claim 7, wherein the roll cleaning tool has a length longer than a width of the substrate.

12. The substrate cleaning apparatus according to claim 7, wherein the predetermined angle is not less than 30 degrees and not more than 90 degrees.

13. The substrate cleaning apparatus according to claim 1, wherein the fluid supply nozzle comprises a slit nozzle having a slit-shaped liquid outlet, or a multi-aperture-nozzle having multiple liquid outlets arranged linearly.

* * * * *